US011693023B2

(12) United States Patent
Takizawa et al.

(10) Patent No.: US 11,693,023 B2
(45) Date of Patent: Jul. 4, 2023

(54) INERTIAL SENSOR AND INERTIAL MEASUREMENT UNIT

(71) Applicant: Seiko Epson Corporation, Tokyo (JP)

(72) Inventors: Teruo Takizawa, Matsumoto (JP); Kazuyuki Nagata, Minowa (JP); Satoru Tanaka, Chino (JP); Seiji Yamazaki, Fujimi (JP)

(73) Assignee: SEIKO EPSON CORPORATION

( * ) Notice: Subject to any disclaimer, the term of this patent is extended or adjusted under 35 U.S.C. 154(b) by 41 days.

(21) Appl. No.: 17/367,701

(22) Filed: Jul. 6, 2021

(65) Prior Publication Data

US 2022/0011339 A1 Jan. 13, 2022

(30) Foreign Application Priority Data

Jul. 7, 2020 (JP) ................................ 2020-116940

(51) Int. Cl.
| | |
|---|---|
| *G01P 15/18* | (2013.01) |
| *B81B 3/00* | (2006.01) |
| *B81B 7/00* | (2006.01) |
| *G01P 15/125* | (2006.01) |
| *G01P 3/48* | (2006.01) |

(52) U.S. Cl.
CPC .............. *G01P 15/18* (2013.01); *B81B 3/001* (2013.01); *B81B 7/0016* (2013.01); *G01P 15/125* (2013.01); *B81B 2201/0235* (2013.01); *B81B 2203/0181* (2013.01); *G01P 3/48* (2013.01)

(58) Field of Classification Search
CPC ........ G01P 15/18; G01P 15/125; G01P 15/08; G01P 2015/0831; G01P 2015/0871; B81B 3/001; B81B 3/0051; B81B 7/0016
See application file for complete search history.

(56) References Cited

U.S. PATENT DOCUMENTS

| | | | | |
|---|---|---|---|---|
| 5,195,371 | A | * | 3/1993 | Greiff ................. G01P 15/0888 73/504.18 |
| 7,121,141 | B2 | * | 10/2006 | McNeil ................. G01P 15/125 73/514.01 |
| 8,020,443 | B2 | * | 9/2011 | Lin ......................... G01P 15/18 73/514.32 |

(Continued)

FOREIGN PATENT DOCUMENTS

| | | |
|---|---|---|
| JP | 2017-509494 A | 4/2017 |
| JP | 2019-045172 A | 3/2019 |

*Primary Examiner* — Helen C Kwok
(74) *Attorney, Agent, or Firm* — Harness, Dickey & Pierce, P.L.C.

(57) ABSTRACT

In an inertial sensor, a first movable body configured to swing around a first rotation axisrotation axis along a first direction has an opening; the opening includes a second movable body configured to swing around a second rotation axisrotation axis along a second direction, a second support beam supporting the second movable body as the second rotation axisrotation axis, a third movable body configured to swing around a third rotation axisrotation axis along the second direction, and a third support beam supporting the third movable body as the third rotation axisrotation axis; and a protrusion is provided at a surface facing the second movable body and the third movable body, or at the second movable body and the third movable body, the protrusion protruding toward the second movable body and the third movable body or the surface.

12 Claims, 14 Drawing Sheets

(56) References Cited

U.S. PATENT DOCUMENTS

| | | | | |
|---|---|---|---|---|
| 8,333,113 | B2* | 12/2012 | Classen | G01P 15/125 |
| | | | | 73/514.32 |
| 9,970,956 | B2* | 5/2018 | Zhang | G01P 15/125 |
| 2004/0079154 | A1* | 4/2004 | Yoshikawa | G01P 15/125 |
| | | | | 73/514.32 |
| 2008/0110260 | A1* | 5/2008 | Konno | G01P 15/125 |
| | | | | 73/514.32 |
| 2008/0173959 | A1* | 7/2008 | Merassi | B81B 3/0051 |
| | | | | 73/514.24 |
| 2010/0078740 | A1 | 4/2010 | Cazzaniga et al. | |
| 2011/0031959 | A1* | 2/2011 | Konno | G01P 15/0802 |
| | | | | 324/162 |
| 2013/0192370 | A1* | 8/2013 | Yoda | G01P 15/02 |
| | | | | 73/514.01 |
| 2015/0241216 | A1 | 8/2015 | Ahtee et al. | |
| 2018/0252744 | A1* | 9/2018 | Kamada | G01P 15/18 |
| 2019/0063924 | A1 | 2/2019 | Tanaka | |
| 2019/0120872 | A1 | 4/2019 | Geisberger | |
| 2020/0355722 | A1* | 11/2020 | Zou | G01P 15/125 |
| 2021/0215735 | A1* | 7/2021 | Tseng | G01P 1/00 |
| 2021/0255212 | A1* | 8/2021 | Nagata | G01P 15/08 |
| 2021/0285981 | A1* | 9/2021 | Rizzini | G01P 15/125 |
| 2021/0405083 | A1* | 12/2021 | Takizawa | B60W 30/00 |

* cited by examiner

INERTIAL SENSOR AND INERTIAL MEASUREMENT UNIT

The present application is based on, and claims priority from JP Application Serial Number 2020-116940, filed Jul. 7, 2020, the disclosure of which is hereby incorporated by reference herein in its entirety.

BACKGROUND

1. Technical Field

The present disclosure relates to an inertial sensor and an inertial measurement unit.

2. Related Art

In recent years, an inertial sensor manufactured using micro electro mechanical systems (MEMS) technology is developed. As such an inertial sensor, for example, JP-A-2019-45172 discloses a physical quantity sensor including a support substrate, a movable body which is disposed on the support substrate, includes first and second mass members, and swings in a seesaw manner around a rotation axis, and first and second fixed electrodes which are provided on the support substrate and are facing the first and second mass members, and the physical quantity sensor is capable of detecting an acceleration in a vertical direction based on a change in electrostatic capacitance between the first and second mass members having different rotational moment about the rotation axisrotation axis of the movable body and the first and second fixed electrodes disposed at positions at which the first and second fixed electrodes are facing the first and second mass members, respectively.

Further, in the physical quantity sensor, in order to prevent the movable body from coming into contact with the first and second fixed electrodes when the movable body excessively swings in a seesaw manner, a protrusion protruding toward the first and second mass members is provided on the support substrate.

However, when the physical quantity sensor described in JP-A-2019-45172 receives strong vibration or impact from an outside, the movable body and the protrusion collide with each other due to excessive seesaw swinging. A short circuit between the movable body and the first and second fixed electrodes can be avoided by the collision of the movable body with the protrusion, but when the impact cannot be absorbed, the movable body and the protrusion may be damaged. That is, when the inertial sensor receives vibration or impact at a certain energy or more, the movable body may collide with the protrusion as one rigid body, and the movable body or a contact portion of the protrusion may be broken. Further, when the movable body repeatedly collides with the protrusion as one rigid body at the constant energy, an operation failure due to a sticking phenomenon called stiction may occur.

SUMMARY

An inertial sensor includes: a substrate; a first movable body disposed on the substrate and configured to swing around a first rotation axisrotation axis along a first direction; a first support beam supporting the first movable body as the first rotation axisrotation axis; and a lid bonded to the substrate and covering the first movable body and the first support beam. The first movable body has an opening, and the opening includes: a second movable body configured to swing around a second rotation axisrotation axis along a second direction intersecting the first direction; a second support beam coupling the first movable body and the second movable body and supporting the second movable body as the second rotation axisrotation axis; a third movable body configured to swing around a third rotation axisrotation axis along the second direction; and a third support beam coupling the first movable body and the third movable body and supporting the third movable body as the third rotation axisrotation axis. A protrusion is provided at a surface of the substrate or the lid facing the second movable body and the third movable body, or at the second movable body and the third movable body, the protrusion overlapping the second movable body and the third movable body in a plan view, and protruding toward the second movable body and the third movable body or the surface.

An inertial measurement unit includes the inertial sensor described above and a control unit configured to perform control based on a detection signal output from the inertial sensor.

DESCRIPTION OF EXEMPLARY EMBODIMENTS

1. First Embodiment

First, an inertial sensor 1 according to a first embodiment will be described with reference to FIGS. 1 and 2 as an example of an acceleration sensor which detects acceleration in a vertical direction.

Figure 1:
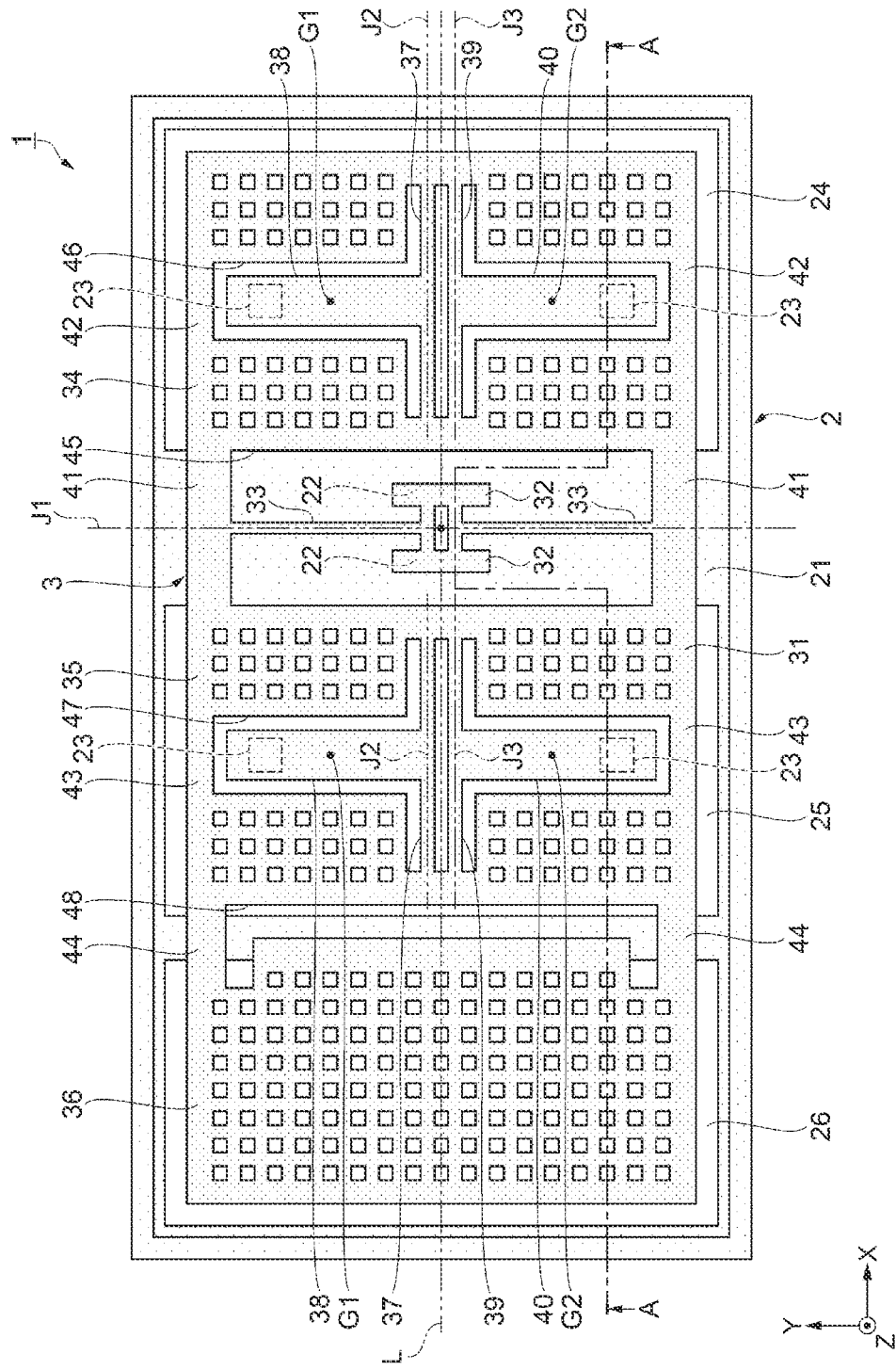
FIG. 1 is a plan view showing a schematic structure of an inertial sensor according to a first embodiment.

For convenience of describing an internal configuration of the inertial sensor 1, FIG. 1 shows a state in which a lid 5 is removed. Further, in FIG. 1, a wiring of a substrate 2 is omitted.

For convenience of description, an X axis, a Y axis, and a Z axis are shown in each figure as three axes orthogonal to each other. A direction along the X axis is referred to as an "X direction", a direction along the Y axis is referred to as a "Y direction", and a direction along the Z axis is referred to as a "Z direction". An arrow tip side in each axial direction is also referred to as a "plus side", a base end side is also referred to as a "minus side", a plus side in the Z direction is referred to as "upper", and a minus side in the Z direction is referred to as "lower". The Z direction is along the vertical direction, and an XY plane is along a horizontal plane. Further, a first direction in the present embodiment is the Y direction, a second direction is the X direction, and a third direction is the Z direction.

Figure 2:
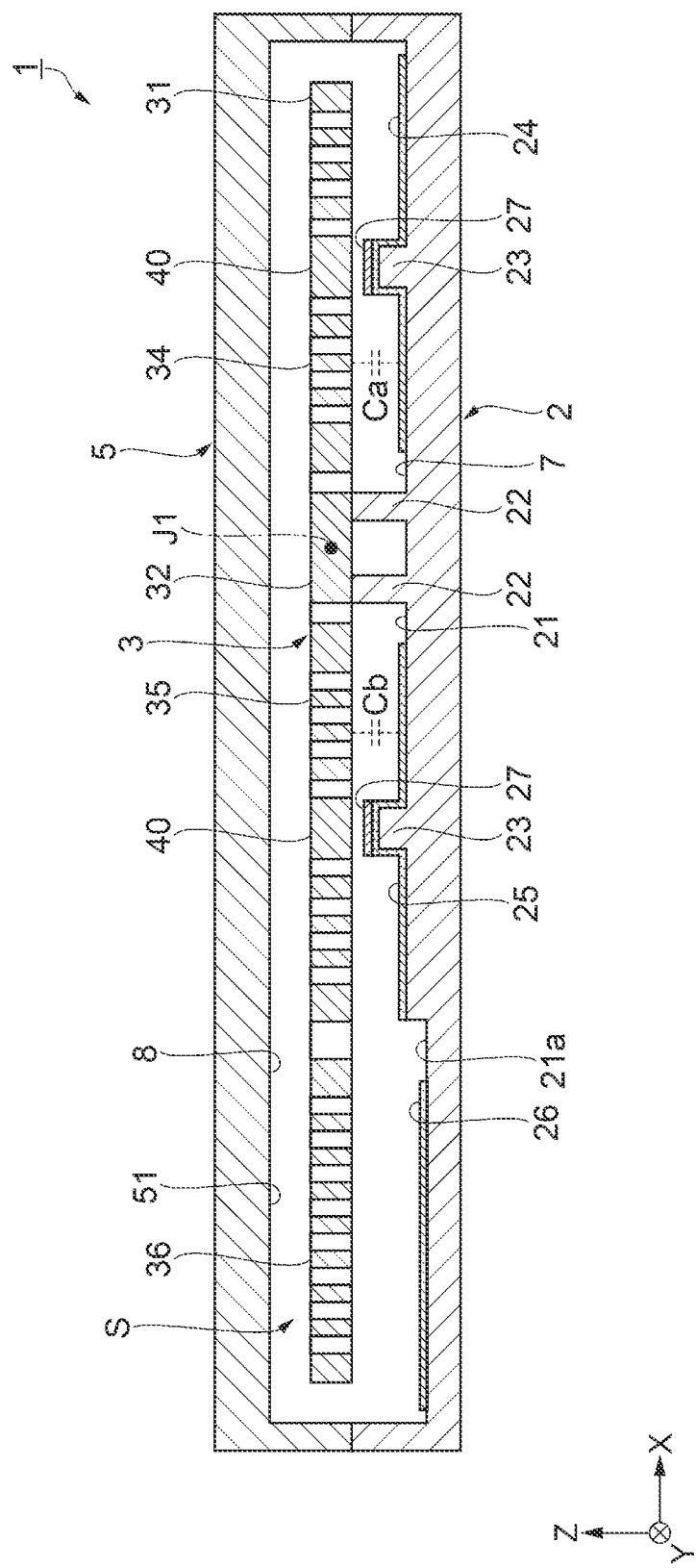
FIG. 2 is a cross-sectional view taken along a line A-A in FIG. 1.

The inertial sensor 1 shown in FIGS. 1 and 2 can detect acceleration in the Z direction, which is the vertical direction of a sensor element 3. Such an inertial sensor 1 includes the substrate 2, the sensor element 3 disposed on the substrate 2, and the lid 5 bonded to the substrate 2 and covering the sensor element 3.

As shown in FIG. 1, the substrate 2 has a spread in the X direction and the Y direction, and a thickness is in the Z direction. As shown in FIG. 2, the substrate 2 includes a recess portion 21 and a recess portion 21a which are recessed toward a lower surface side and have different depths. A depth of the recess portion 21a from an upper surface is larger than that of the recess portion 21. The recess portion 21 and the recess portion 21a include the sensor element 3 inside in a plan view from the Z direction, and is formed larger than the sensor element 3. The recess portion 21 and the recess portion 21a functions as a relief portion that prevents contact between the sensor element 3 and the substrate 2. Further, the substrate 2 includes fixing members 22 and protrusions 23 which protrude from a surface 7, which is a bottom surface of the recess portion 21, to the sensor element 3 side, a first detection electrode 24 and a second detection electrode 25 are disposed on the bottom surface of the recess portion 21, and a dummy electrode 26 is disposed on a bottom surface of the recess portion 21a. The first detection electrode 24 and the second detection electrode 25 have substantially the same area. The two different detection electrodes are each coupled to a QV amplifier, which will be described later, and an electrostatic capacitance difference thereof is detected as an electric signal by a differential detection method. Therefore, it is desirable that the first detection electrode 24 and the second detection electrode 25 have the same area. Then, the sensor element 3 is bonded to upper surfaces of the fixing members 22. The protrusions 23 are disposed at positions where the protrusions 23 overlap a second movable body 38 and a third movable body 40, which will be described later, in the plan view from the Z direction. In the present embodiment, a position of a lower surface of the sensor element 3 disposed on the substrate 2 coincides with a bonded surface between the substrate 2 and the lid 5, but the sensor element 3 is only required to be accommodated in a space surrounded by the substrate 2 and the lid 5, and does not depend on a positional relationship with the bonded surface or shapes of the recess portion 21 and the recess portion 21a.

When a first movable body 31 is not provided with the second movable body 38 and the third movable body 40 to be described later, the protrusions 23 function as a stopper which comes into contact with the first movable body 31 when excessive seesaw swinging occurs in the first movable body 31, so as to restrict the first movable body 31 from further seesaw swinging. By providing such protrusions 23, it is possible to prevent the first movable body 31 from being excessively close to the first detection electrode 24 and the second detection electrode 25 having different potentials from each other. In general, since an electrostatic attractive force is generated between electrodes having different potentials, when the first movable body 31 is excessively close, the electrostatic attractive force generated between the first movable body 31 and the first detection electrode 24 and between the first movable body 31 and the second detection electrode 25 causes "pull-in" in which the first movable body 31 does not return after being attracted to the first detection electrode 24 or the second detection electrode 25. In such a state, the inertial sensor 1 does not operate normally, and therefore, it is important to provide the protrusions 23 to prevent the first movable body 31 from being excessively close to the first detection electrode 24 and the second detection electrode 25. As described above, since the first movable body 31, the first detection electrode 24, and the second detection electrode 25 have different potentials from each other, the protrusions 23 are provided with insulating layers 27 for preventing a short circuit. As a material of the insulating layers 27, silicon oxide $SiO_2$, silicon nitride $Si_3N_4$, and the like are used.

As the substrate 2, for example, a glass substrate made of a glass material containing an alkali metal ion which is a movable ion such as Nat, for example, borosilicate glass such as Pyrex (registered trademark) glass and Tempax (registered trademark) glass can be used. However, the substrate 2 is not particularly limited, and for example, a silicon substrate, a quartz substrate, a silicon on insulator (SOI) substrate, and the like may be used.

As shown in FIG. 2, the lid 5 is formed with a recess portion 51 recessed toward an upper surface side. The lid 5 accommodates the sensor element 3 in the recess portion 51 and is bonded to an upper surface of the substrate 2. An accommodation space S in which the sensor element 3 is accommodated is formed inside the lid 5 and the substrate 2. The accommodation space S is an airtight space in which an inert gas such as nitrogen, helium, and argon is sealed, and it is preferable that the accommodation space S has a use temperature of about −40° C. to 125° C. and a substantially atmospheric pressure. However, an atmosphere of the accommodation space S is not particularly limited, and may be, for example, a depressurized state or a pressurized state.

As the lid 5, for example, a silicon substrate can be used. However, the lid is not particularly limited, and for example, a glass substrate and a quartz substrate may be used. Further, a method of bonding the substrate 2 and the lid 5 is not particularly limited, and may be appropriately selected depending on materials for the substrate 2 and the lid 5. For example, anodic bounding, activated bonding in which bonding surfaces activated by plasma irradiation are bonded to each other, bonding using a bonding material such as glass frit, metal eutectic bonding in which metal films formed on the upper surface of the substrate 2 and the lower surface of the lid 5 are bonded to each other, and the like can be used.

The sensor element 3 is formed, for example, by etching a conductive silicon substrate doped with impurities such as phosphorus (P), boron (B), and arsenic (As), particularly by vertical processing using a Bosch process, which is a deep etching technique.

As shown in FIG. 1, the sensor element 3 includes a holding member 32 bonded to the upper surfaces of the fixing members 22, the first movable body 31 which is swingable around a first rotation axisrotation axis J1 along the Y direction which is the first direction, a first support beam 33 which supports the first movable body 31 as the first rotation axisrotation axis J1, second movable bodies 38 which are swingable around a second rotation axisrotation axis J2 along the X direction which is the second direction orthogonal to the Y direction, second support beams 37 which couple the first movable body 31 and the second movable bodies 38 and support the second movable bodies 38 as the second rotation axisrotation axis J2, third movable bodies 40 which are swingable around a third rotation axisrotation axis J3 along the X direction, and third support beams 39 which couple the first movable body 31 and the third movable bodies 40 and support the third movable bodies 40 as the third rotation axisrotation axis J3. For example, the fixing members 22 and the holding member 32 are anodically bonded to each other, and the first support beam 33 couples the first movable body 31 and the fixing members 22 via the holding member 32.

The first movable body 31 has a rectangular shape whose longitudinal direction is the X direction in a plan view from the Z direction. The first movable body 31 includes a first mass member 34 and a second mass member 35 which are disposed with the first rotation axisrotation axis J1 along the Y direction sandwiched therebetween in a plan view from the Z direction, and a third mass member 36 which is coupled to both ends of the second mass member 35 in the Y direction by fourth coupling members 44. Further, a fourth opening 48 is provided between the second mass member 35 and the third mass member 36 in order to make an area of the first mass member 34 equal to an area of the second mass member 35. The first mass member 34 is located on a plus side in the X direction with respect to the first rotation axisrotation axis J1, and the second mass member 35 and the third mass member 36 are located on a minus side in the X direction with respect to the first rotation axisrotation axis J1. Further, the second mass member 35 and the third mass member 36 are longer in the X direction than the first mass member 34, and rotational moment around the first rotation axisrotation axis J1 when an acceleration Az in the Z direction is applied is larger than that of the first mass member 34.

Due to a difference in the rotational moment, the first movable body 31 swings in a seesaw manner around the first rotation axisrotation axis J1 when the acceleration Az is applied. The seesaw swinging means that when the first mass member 34 is displaced to the plus side in the Z direction, the second mass member 35 is displaced to the minus side in the Z direction, and conversely, when the first mass member 34 is displaced to the minus side in the Z direction, the second mass member 35 is displaced to the plus side in the Z direction.

In the first movable body 31, the first mass member 34 and the second mass member 35 are coupled by first coupling members 41, and a first opening 45 is provided between the first mass member 34 and the second mass member 35. Further, in the first opening 45, the holding members 32 and the first support beams 33 are disposed. In this way, by disposing the holding members 32 and the first support beams 33 inside the first movable body 31, it is possible to achieve miniaturization of the sensor element 3.

Further, the first movable body 31 has a plurality of through holes uniformly formed in an entire area thereof. Accordingly, damping due to viscosity can be optimized. That is, when the acceleration is applied in a normal operation, the seesaw swinging can be easily converged by a damping effect. The damping effect has an adverse effect on a detection operation when the damping effect is too high or too low. In a general inertial sensor which detects acceleration, an atmospheric pressure in the accommodation space S is set to 0.1 to 1.0 times the atmospheric pressure, and the inertial sensor is appropriately designed according to a shape and the number of the through holes. As long as a necessary and sufficient damping effect is obtained, the through holes may be omitted, or an arrangement thereof may not be uniform.

Further, in the first movable body 31, the first coupling members 41 and the holding members 32 arranged in the Y direction are coupled by the first support beam 33 extending in the Y direction. Therefore, the first support beam 33 can be used as the first rotation axisrotation axis J1, and the first movable body 31 can be displaced by the seesaw swinging around the first rotation axisrotation axis J1.

The first mass member 34 includes two mass members, and both ends thereof in the Y direction are coupled to each other by second coupling members 42. Therefore, the first mass member 34 has a second opening 46 in a central portion. When a center line L along the X direction of the first movable body 31 is defined as a line bisecting the first movable body 31 in the Y direction, inside the second opening 46 and on a plus side in the Y direction of the center line L, the second movable body 38 extending in the Y direction is disposed, and the second support beams 37 coupling both sides in the X direction of end portions on the center line L side of the second movable bodies 38 to the two mass members are disposed. The second support beams 37 extend to the plus side and the minus side in the X direction, and coincide with the second rotation axisrotation axis J2 along which the second movable body 38 is moved in the Z direction. Although the first mass member 34 includes the two mass members, the first mass member 34 functions as one mass member having high rigidity because the two mass members are firmly coupled with each other by the second coupling members 42. In other words, the second coupling members 42 serve to increase the rigidity of the first mass member 34. In this way, a parasitic vibration mode of the first mass member 34 can be prevented.

Further, on the minus side in the Y direction with respect to the center line L of the second opening 46, the third movable body 40 extending in the Y direction is disposed, and two third support beams 39 extending on the plus side and the minus side in the X direction and coupling both sides in the X direction of end portions on the center line L side of the third movable bodies 40 to the two mass members are disposed.

The second movable bodies 38 and the second support beams 37, and the third movable bodies 40 and the third support beams 39 are disposed in line symmetry with respect to the center line L as a symmetry axis. In this way, by symmetrically disposing the second movable bodies 38 and the second support beams 37, and the third movable bodies 40 and the third support beams 39, it is possible to eliminate an adverse effect of a parasitic capacitance, and to equalize an input charge amount to the QV amplifier to be described later in a natural state in which the acceleration Az is not applied. Therefore, highly accurate detection with a small offset amount can be performed.

Further, a center of gravity G1 of the second movable body 38 is closer to the second support beam 37 than the center line L, and a center of gravity G2 of the third movable body 40 is closer to the third support beam 39 than the center line L. That is, free ends of the second movable body 38 and the third movable body 40 are located on a side opposite to a side at which the second movable body 38 and the third movable body 40 are coupled to the second support beam 37 and the third support beam 39, and are located on outer edge sides of the first movable body 31. Therefore, when an impact in which a displacement amount in the Z direction is different is applied to both ends of the first movable body 31 in the Y direction, the free end of the second movable body 38 or the third movable body 40 on an end portion side at which the displacement amount is large comes into contact with the protrusion 23, and the impact can be reduced. Further, since the second movable body 38, the second support beam 37, the third movable body 40, and the third support beam 39 are disposed in the second opening 46 of the first mass member 34, when an impact is applied from an XY in-plane direction such as the X direction and the Y direction, tip portions of the free ends of the second movable body 38 and the third movable body 40 come into contact with the second coupling members 42 and the first mass member 34, and thus, impact energy is dissipated, and damages of the second support beam 37 and the third support beam 39 can be reduced.

Further, the second support beam 37 coincides with the end portion on the center line L side of the second movable body 38, and the third support beam 39 coincides with the end portion on the center line L side of the third movable body 40. That is, intervals between the center line L and the second support beam 37 and the third support beam 39 are equal to intervals between the end portions of the second movable body 38 and the third movable body 40 on the center line L side and the center line L. Therefore, torsional rigidities of the second support beam 37 and the third support beam 39 around the second rotation axisrotation axis J2 and the third rotation axisrotation axis J3 are weak, and when the acceleration Az in the Z direction is applied, the free end of the second movable body 38 or the third movable body 40 is displaced to come closer to the first detection electrode 24 than the first movable body 31, so that detection sensitivity can be improved.

Similarly to the first mass member 34, the second mass member 35 includes two mass members, and both ends thereof in the Y direction are coupled to each other by third coupling members 43. Therefore, the second mass member 35 has a third opening 47 in a central portion. Similarly to the first mass member 34, the second movable body 38, the second support beam 37, the third movable body 40, and the third support beam 39 are disposed in the third opening 47. The second movable body 38, the second support beam 37, the third movable body 40, and the third support beam 39, which are disposed in the third opening 47 of the second mass member 35, and the second movable body 38, the second support beam 37, the third movable body 40, and the third support beam 39, which are disposed in the second opening 46 of the first mass member 34, are disposed in line symmetry with respect to the first rotation axisrotation axis J1 as the symmetry axis. Therefore, the second mass member 35 can also obtain the same effect as the first mass member 34. Although the second mass member 35 includes the two mass members, the second mass member 35 functions as one mass member having high rigidity because the two mass members are firmly coupled with each other by the third coupling members 43. In other words, the third coupling members 43 serve to increase rigidity of the second mass member 35. In this way, a parasitic vibration mode of the second mass member 35 can be prevented.

Since the second support beams 37 and the third support beams 39 disposed at the first mass member 34 and the second mass member 35 have a beam shape extending in the X direction, the second support beams 37 and the third support beams 39 can act as the second rotation axisrotation axis J2 and the third rotation axisrotation axis J3 along the X direction intersecting the first rotation axisrotation axis J1, so that the second movable bodies 38 coupled to the second support beams 37 can be displaced around the second rotation axisrotation axis J2, and the third movable bodies 40 coupled to the third support beams 39 can be displaced around the third rotation axisrotation axis J3. Further, the protrusions 23 provided at the substrate 2 are disposed at positions overlapping the tip portions of the free ends of the second movable bodies 38 and the third movable bodies 40 in the plan view from the Z direction.

In the present embodiment, the second rotation axisrotation axis J2 and the third rotation axisrotation axis J3 of the second support beams 37 and the third support beams 39 are set in a direction along the X direction orthogonal to the first rotation axisrotation axis J1 along the Y direction of the first support beams 33, so that resistance to an impact from the X direction is improved in a state in which a stopper function is provided, but the present disclosure is not limited thereto, and the second rotation axisrotation axis J2 and the third rotation axisrotation axis J3 may not be orthogonal to the first rotation axisrotation axis J1. That is, the second rotation axisrotation axis J2 and the third rotation axisrotation axis J3 are only required to be within a range of 90°±10° with respect to the first rotation axisrotation axis J1. When the second rotation axisrotation axis J2 and the third rotation axisrotation axis J3 are configured to be in line symmetry with respect to the center line L and the first rotation axisrotation axis J1 in this range, the same effect as the effect of the present embodiment described above can be obtained.

Next, the first detection electrode 24 and the second detection electrode 25 disposed at the bottom surface of the recess portion 21 and the dummy electrode 26 disposed at the bottom surface of the recess portion 21a will be described.

As shown in FIGS. 1 and 2, in the plan view from the Z direction, the first detection electrode 24 is disposed so as to overlap the first mass member 34, and the second detection electrode 25 is disposed so as to overlap the second mass member 35. The first detection electrode and the second detection electrode 25 are provided substantially symmetrically to the first rotation axisrotation axis J1 in the plan view from the Z direction such that electrostatic capacitances Ca and Cb, which will be described later, are equal in a natural state in which the acceleration Az is not applied. The insulating layers 27 are provided at members at which the first detection electrode 24 and the second detection electrode 25 overlap the protrusions 23. The insulating layers 27 prevent a short circuit between the first movable body 31 and the first detection electrode 24 and between the first movable body 31 and the second detection electrode 25.

Further, the dummy electrode 26 is located on the minus side in the X direction with respect to the second detection electrode 25, and is provided so as to overlap the third mass member 36. In this way, by covering the bottom surface of the recess portion 21a with the dummy electrode 26, it is possible to prevent charging of the bottom surface of the recess portion 21a due to movement of alkali metal ions in the substrate 2. Therefore, it is possible to effectively prevent generation of an unintended electrostatic attractive force which leads to a malfunction of the first movable body 31 between the bottom surface of the recess portion 21 and the second mass member 35. Therefore, the inertial sensor 1 can detect the acceleration Az more accurately.

The first detection electrode 24 and the second detection electrode 25 are electrically coupled to the differential QV amplifier (not shown). When the inertial sensor 1 is driven, a drive signal is applied to the sensor element 3, so that the electrostatic capacitance Ca is generated between the first mass member 34 and the first detection electrode 24. Similarly, the electrostatic capacitance Cb is generated between the second mass member 35 and the second detection electrode 25. In the natural state in which the acceleration Az is not applied, the electrostatic capacitances Ca and Cb are substantially equal to each other.

When the acceleration Az is applied to the inertial sensor 1, the first movable body 31 swings in a seesaw manner around the first rotation axisrotation axis J1. Due to the seesaw swinging of the first movable body 31, a gap between the first mass member 34 and the first detection electrode 24 and a gap between the second mass member 35 and the second detection electrode 25 change in opposite phases, and accordingly, the electrostatic capacitances Ca and Cb change in the opposite phases. Therefore, the inertial sensor 1 can detect the acceleration Az based on a difference between capacitance values of the electrostatic capacitances Ca and Cb.

Next, an operation of the inertial sensor 1 according to the embodiment will be described with reference to FIGS. 3 and 4.

Figure 3:
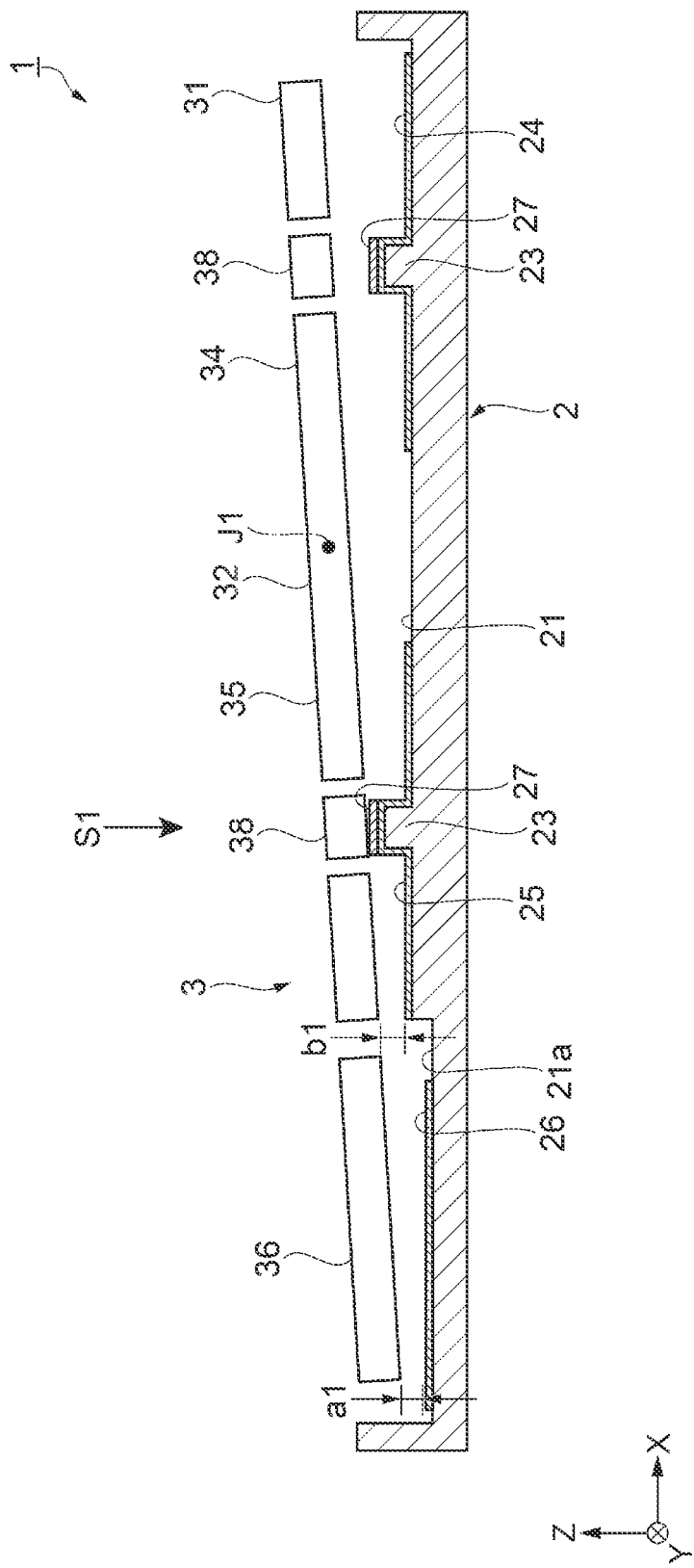
FIG. 3 is a schematic diagram showing an operation of the inertial sensor.
Figure 4:
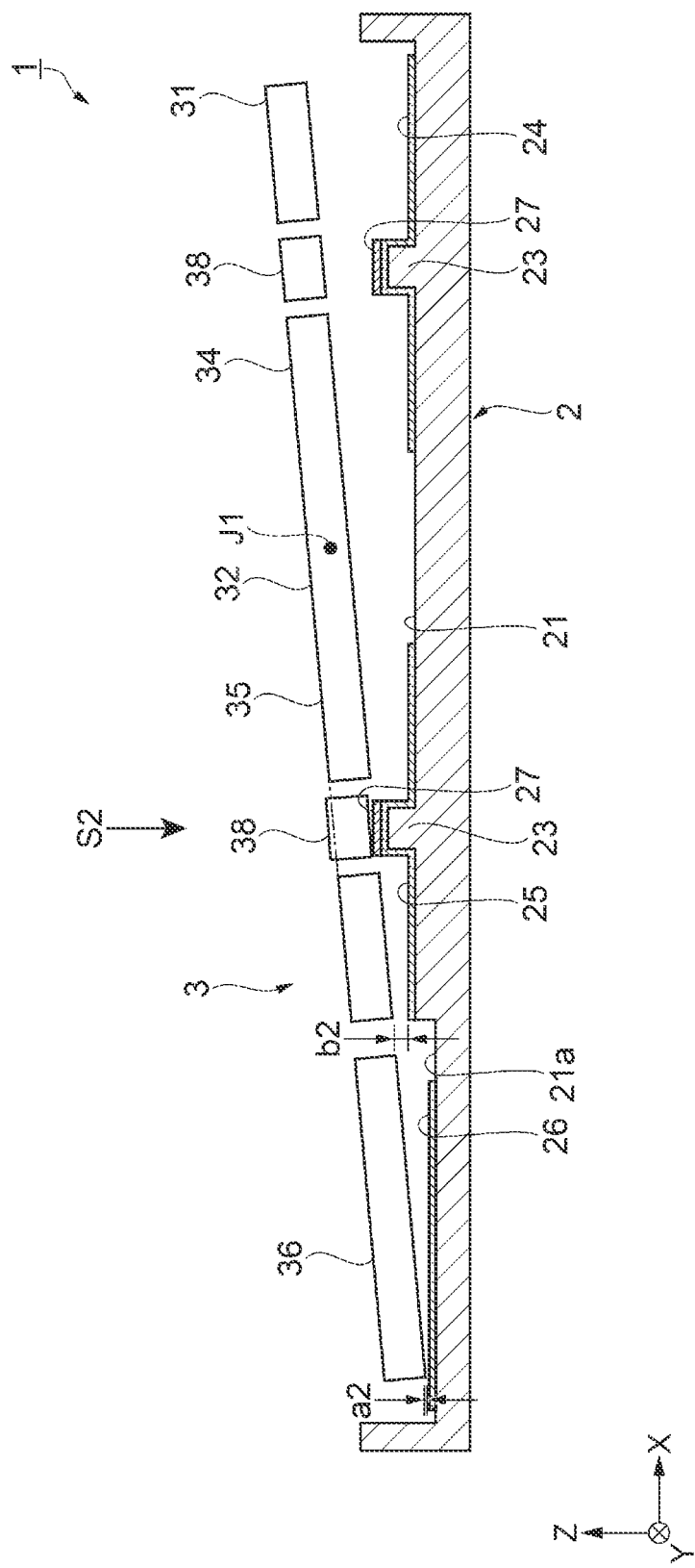
FIG. 4 is a schematic diagram showing an operation of the inertial sensor.

FIGS. 3 and 4 are diagrams schematically showing the operation of the inertial sensor 1 when acceleration S1 and acceleration S2 exceeding a measurable maximum value, for example, about 50 G, are applied to the inertial sensor 1 as the acceleration Az in the Z direction. Directions of the acceleration S1 and acceleration S2 are on the minus side in the Z direction, and magnitudes of absolute values of the acceleration S1 and acceleration S2 satisfy the measurable maximum value<S1<S2. For convenience of explanation, the lid 5, the fixing members 22, and the like are omitted.

As shown in FIG. 3, when the acceleration S1 is applied to the inertial sensor 1 as the acceleration Az in the Z direction, the first movable body 31 swings in a seesaw manner around the first rotation axisrotation axis J1, and the second movable body 38 and the protrusion 23 come into contact with each other. At this time, when a shortest distance between the third mass member 36 and the dummy electrode 26 is a1 and a shortest distance between the second mass member 35 and the second detection electrode 25 is b1, a relationship of a1<b1 is established. Although the relationship between the a1 and the b1 is a design matter, when a capacitance detection method is performed, since a short circuit between a movable electrode and a detection electrode causes a failure of the QV amplifier in the subsequent stage, it is desirable that b1>a1≠0.

The torsional rigidity of the second support beam 37 around the second rotation axisrotation axis J2 is higher than the torsional rigidity of the first support beam 33 around the first rotation axisrotation axis J1. Therefore, since a displacement amount of the second movable body 38 caused by the second support beam 37 is smaller than a displacement amount of the first movable body 31 caused by the first support beam 33, the second support beam 37 and the second movable body 38 can function as the stopper. Until the second movable body 38 and the protrusion 23 are in contact with each other, energy of deformation is not accumulated because torsion is not generated in the second support beam 37.

Further, a resonance frequency of the second movable body 38 around the second rotation axisrotation axis J2 is twice or more a resonance frequency of the first movable body 31 around the first rotation axisrotation axis J1. By setting the resonance frequency of the second movable body 38 around the second rotation axisrotation axis J2 to be twice or more the resonance frequency of the first movable body 31 around the first rotation axisrotation axis J1, when the acceleration Az in the Z direction is detected, the acceleration Az can be detected in a state in which the second movable body 38 is substantially stationary with respect to the first movable body 31, that is, in a state in which it can be considered that the first movable body 31 and the second movable body 38 swing in a seesaw manner around the first rotation axisrotation axis J1 as one rigid body.

Since the acceleration Az can be detected in the state in which it can be considered that the first movable body 31 and the second movable body 38 swing in a seesaw manner around the first rotation axisrotation axis J1 as one rigid body, an influence caused by the vibration of the second movable body 38 is small, and the detection can be performed with high accuracy. Further, the second movable body 38 can be used as an electrode for generating the electrostatic capacitance Ca between the first mass member 34 and the first detection electrode 24 and the electrostatic capacitance Cb between the second mass member 35 and the second detection electrode 25 together with the first mass member 34 and the second mass member 35. Therefore, the electrostatic capacitances Ca and Cb can be increased, and the detection with higher accuracy can be performed.

In the present embodiment, for example, the resonance frequency of the second movable body 38 around the second rotation axisrotation axis J2 is 1 kHz to 2 kHz, and the resonance frequency of the first movable body 31 around the first rotation axisrotation axis J1 is 5 kHz. In order to set the resonance frequency of the second movable body 38 around the second rotation axisrotation axis J2 twice or more the resonance frequency of the first movable body 31 around the first rotation axisrotation axis J1, for example, the torsional rigidity of the second support beam 37 around the second rotation axisrotation axis J2 is only required to be set higher than the torsional rigidity of the first support beam 33 around the first rotation axisrotation axis J1.

As shown in FIG. 4, when the acceleration S2 larger than the acceleration S1 is applied to the inertial sensor 1 as the acceleration Az in the Z direction, the second movable body 38 and the protrusion 23 come into contact with each other, and the first movable body 31 and the recess portion 21*a* collide with each other while the second movable body 38 is pushed up to the plus side in the Z direction by the protrusion 23. At this time, a shortest distance a2 between the third mass member 36 and the dummy electrode 26 and a shortest distance b2 between the second mass member 35 and the second detection electrode 25 satisfy b2>a2=0. When the second movable body 38 is pushed up to the plus side in the Z direction, the second support beam 37 is deformed so as to be twisted around the second rotation axisrotation axis J2. That is, energy of deformation is accumulated in the second support beam 37. In this way, the second support beam 37 is deformed so as to be twisted around the second rotation axisrotation axis J2, so that a part of the impact energy applied to the inertial sensor 1 by the acceleration S2 is accumulated and absorbed by the second support beam 37, and therefore, the impact energy caused by collision between the first movable body 31 and the recess portion 21*a* is alleviated, and stiction is less likely to occur.

Further, when the excessive seesaw swinging occurs in the first movable body 31, the second movable body 38 and the protrusion 23 come into contact with each other, and the second support beam 37 is deformed so as to be twisted around the second rotation axisrotation axis J2, so that a part of the impact energy applied to the inertial sensor 1 is accumulated and absorbed by the second support beam 37, and thus, the impact with the protrusion 23 can be reduced, and the first movable body 31 can be restricted from further seesaw swinging while reducing damage to the second movable body 38, the protrusion 23, and the like. Therefore, the second support beam 37 and the second movable body 38 can function as a damper that absorbs the impact.

The third support beam 39 and the third movable body 40 are also similar to the second support beam 37 and the second movable body 38, the torsional rigidity of the third support beam 39 around the third rotation axisrotation axis J3 is higher than the torsional rigidity of the first support beam 33 around the first rotation axisrotation axis J1, and the third support beam 39 and the third movable body 40 can function as the stoppers. Further, a resonance frequency of the third movable body 40 around the third rotation axisrotation axis J3 is twice or more the resonance frequency of the first movable body 31 around the first rotation axisrotation axis J1, an influence caused by the vibration of the third movable body 40 is small, and the detection can be performed with high accuracy.

Further, when the second movable body 38 vibrates around the second rotation axisrotation axis J2 and the third movable body 40 vibrates around the third rotation axisrotation axis J3, a vibration mode thereof is separated into an in-phase mode and an out-of-phase mode. The resonance frequency of the second movable body 38 in the in-phase mode around the second rotation axisrotation axis J2 and the resonance frequency of the third movable body 40 in the in-phase mode around the third rotation axisrotation axis J3 are twice or more the resonance frequency of the first movable body 31 around the first rotation axisrotation axis J1. By setting the resonance frequency of the second movable body 38 in the in-phase mode around the second rotation axisrotation axis J2 and the resonance frequency of the third movable body 40 in the in-phase mode around the third rotation axisrotation axis J3 twice or more the resonance frequency of the first movable body 31 around the first rotation axisrotation axis J1, when the acceleration Az in the Z direction is detected, the second movable body 38 and the third movable body 40 can be regarded as a substantially stationary state with respect to the first movable body 31. That is, it can be considered that the second movable body 38 and the third movable body 40 swing in the seesaw manner around the first rotation axisrotation axis J1 as one rigid body with the first movable body 31. By setting the resonance frequency of the second movable body 38 in the in-phase mode around the second rotation axisrotation axis J2 and the resonance frequency of the third movable body 40 in the in-phase mode around the third rotation axisrotation axis J3 twice or more the resonance frequency of the first movable body 31 around the first rotation axisrotation axis J1, the acceleration Az can be detected in such a state.

The inertial sensor 1 according to the present embodiment includes the second movable bodies 38 and the third movable bodies 40 which are displaceable by deformation of the second support beams 37 and the third support beams 39 provided in the first movable body 31, and the protrusions 23 which are provided at the substrate 2, overlap the second movable bodies 38 and the third movable bodies 40 in the plan view from the Z direction, and protrude toward the second movable bodies 38 and the third movable bodies 40. Therefore, when the second movable body 38 and the third movable body 40 come into contact with the protrusions 23 when the excessive seesaw swinging occurs in the first movable body 31, since the second support beam 37 and the third support beam 39 are deformed so as to be twisted around the second rotation axisrotation axis J2 and the third rotation axisrotation axis J3, the impact with the protrusions 23 can be reduced, and the damage of the first movable body 31 and the protrusions 23 can be reduced.

Further, the second movable bodies 38, the second support beams 37, the third movable bodies 40, and the third support beams 39 are provided at the second opening 46 and the third opening 47 of the first movable body 31. Therefore, when the impact is applied from the XY in-plane direction such as the X direction and the Y direction, the tip portions of the free ends of the second movable body 38 and the third movable body 40 come into contact with the second coupling members 42 and the third coupling members 43, or the first mass member 34 and the second mass member 35. Accordingly, the impact energy can be dissipated, and damage to the second support beam 37 and the third support beam 39 can be reduced. Further, even when the second opening 46 and the third opening 47 are provided in a large area in the first movable body 31, since the first mass member 34 is coupled by the second coupling members 42 and the second mass member 35 is coupled by the third coupling members 43, the rigidity is high, and the parasitic vibration mode is less likely to occur in the first mass member 34 and the second mass member 35. In this way, it is possible to prevent damage due to the parasitic vibration mode when the excessive seesaw swinging occurs due to a strong impact.

2. Second Embodiment

Figure 5:
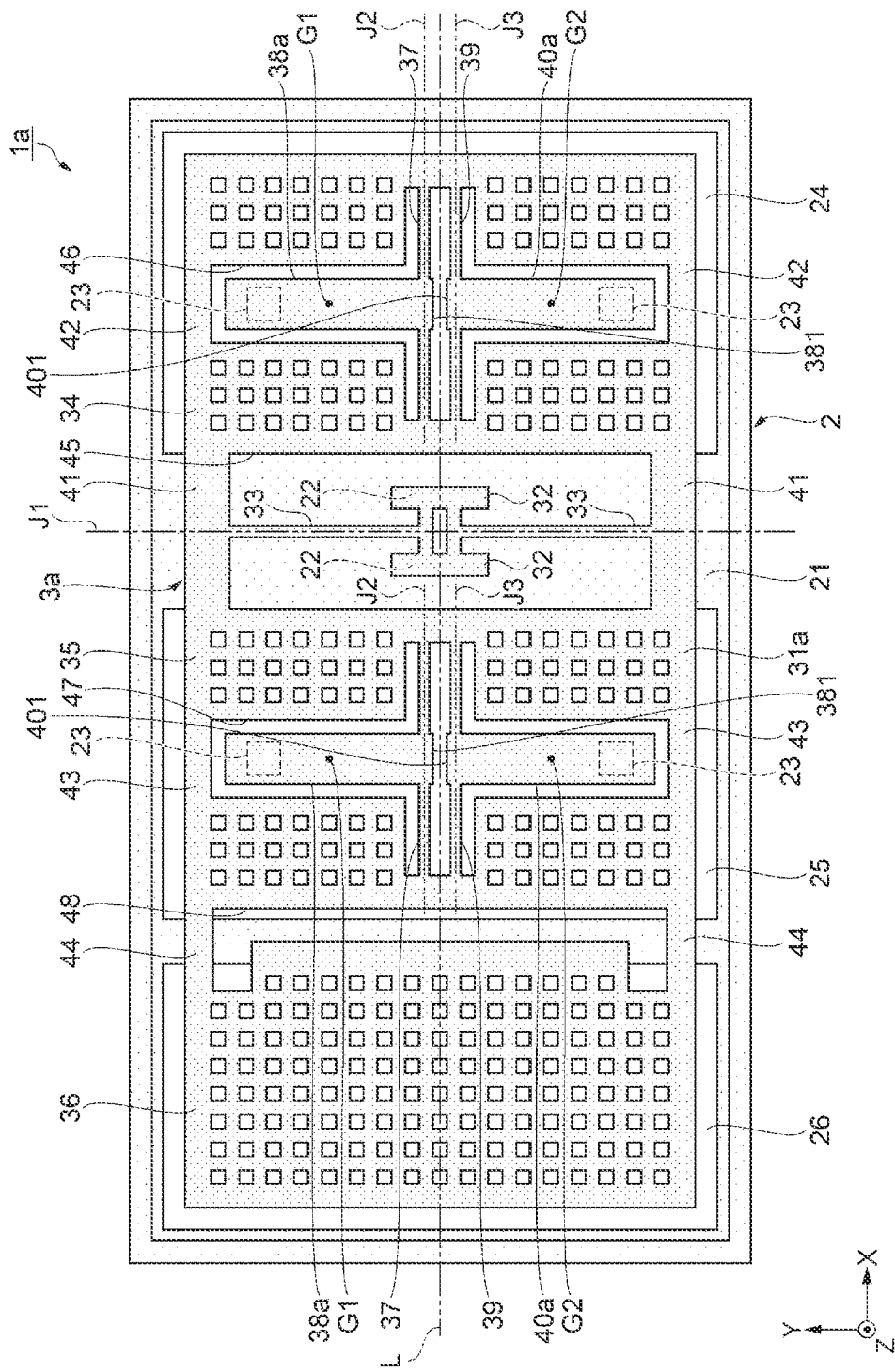
FIG. 5 is a plan view showing a schematic structure of an inertial sensor according to a second embodiment.

Next, an inertial sensor 1a according to a second embodiment will be described with reference to FIG. 5. FIG. 5 shows a state in which the lid 5 is removed for convenience of description.

The inertial sensor 1a according to the present embodiment is similar to the inertial sensor 1 according to the first embodiment except that a structure of a sensor element 3a is different from that of the inertial sensor 1 according to the first embodiment. Differences from the first embodiment described above will be mainly described, and the description of the similar matters will be omitted.

As shown in FIG. 5, in the sensor element 3a of the inertial sensor 1a, end portions 381 and 401 on the center line L side of second movable bodies 38a and third movable bodies 40a provided at the second opening 46 and the third opening 47 are closer to the center line L than the second support beams 37 and the third support beams 39. That is, intervals between the center line L and the end portions 381 and 401 on the center line L side of the second movable bodies 38a and the third movable bodies 40a are smaller than intervals between the center line L and the second support beam 37 and the third support beam 39.

With such a configuration, it is possible to improve impact resistance of the second support beam 37 and the third support beam 39 against an impact from an XY in-plane direction such as an X direction and a Y direction, and it is possible to obtain the same effect as that of the inertial sensor 1 according to the first embodiment.

3. Third Embodiment

Figure 6:
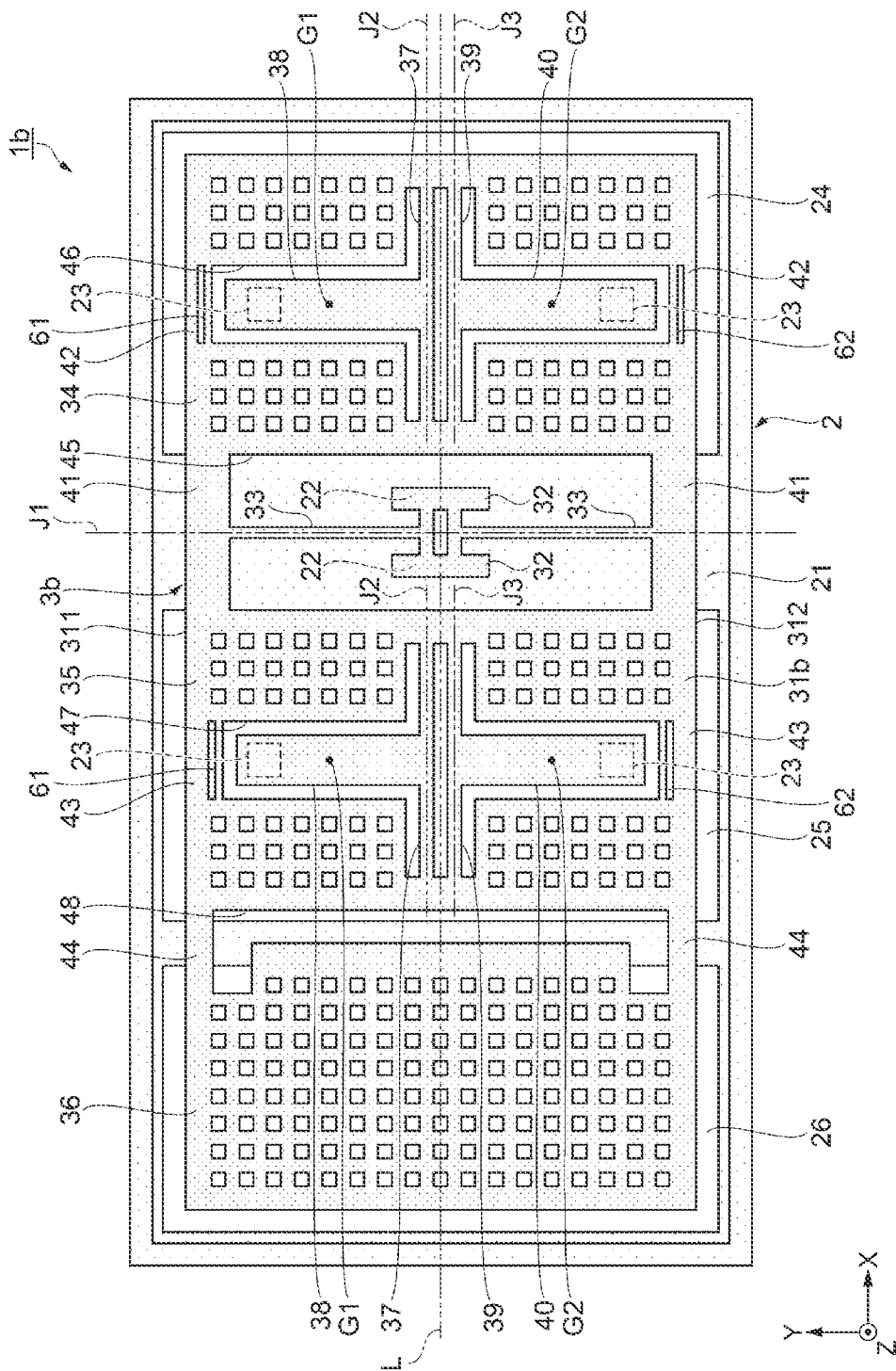
FIG. 6 is a plan view showing a schematic structure of an inertial sensor according to a third embodiment.

Next, an inertial sensor 1b according to a third embodiment will be described with reference to FIG. 6. FIG. 6 shows a state in which the lid 5 is removed for convenience of description.

The inertial sensor 1b according to the present embodiment is similar to the inertial sensor 1 according to the first embodiment except that a structure of a sensor element 3b is different from that of the inertial sensor 1 according to the first embodiment. Differences from the first embodiment described above will be mainly described, and the description of the similar matters will be omitted.

As shown in FIG. 6, the sensor element 3b of the inertial sensor 1b is configured such that, in the first mass member 34 and the second mass member 35, first elastic members 61 are provided between one end 311 of a first movable body 31b in the Y direction and the second movable bodies 38, and second elastic members 62 are provided between the other end 312 of the first movable body 31b in the Y direction and the third movable bodies 40.

The first elastic members 61 and the second elastic members 62 have a beam shape extending in the X direction. Both ends of the first elastic member 61 and the second elastic member 62 provided at the first mass member 34 side are coupled to the first mass member 34, and both ends of the first elastic member 61 and the second elastic member 62 provided at the second mass member 35 side are coupled to the second mass member 35.

Since the first elastic members 61 and the second elastic members 62 have a beam shape extending in the X direction, they have a spring property in the Y direction. Therefore, when the second movable body 38 and the third movable body 40 are displaced in the X direction by the impact from the X direction, and end portions on an free end side of the second movable body 38 and the third movable body 40 come into contact with the first elastic member 61 and the second elastic member 62, the impact can be alleviated.

With such a configuration, damage to the second movable body 38 and the third movable body 40 due to the impact from the X direction is reduced, impact resistance of the second support beam 37 and the third support beam 39 is improved, and the same effects as those of the inertial sensor 1 according to the first embodiment can be obtained.

4. Fourth Embodiment

Figure 7:
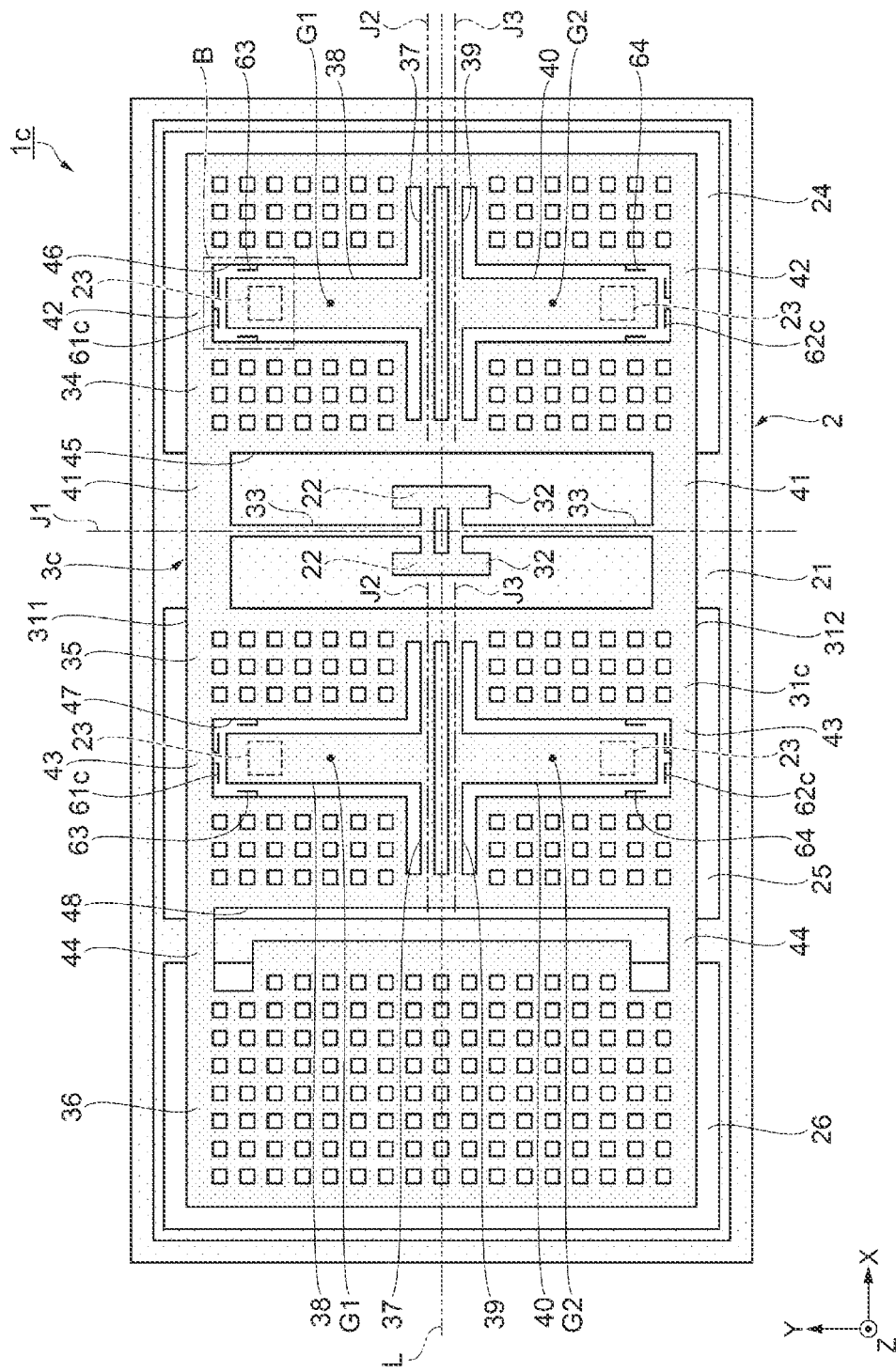
FIG. 7 is a plan view showing a schematic structure of an inertial sensor according to a fourth embodiment.

Next, an inertial sensor 1c according to a fourth embodiment will be described with reference to FIGS. 7 and 8. FIG. 7 shows a state in which the lid 5 is removed for convenience of description.

The inertial sensor 1c according to the present embodiment is similar to the inertial sensor 1 according to the first embodiment except that a structure of a sensor element 3c is different from that of the inertial sensor 1 according to the first embodiment. Differences from the first embodiment described above will be mainly described, and the description of the similar matters will be omitted.

Figure 8:
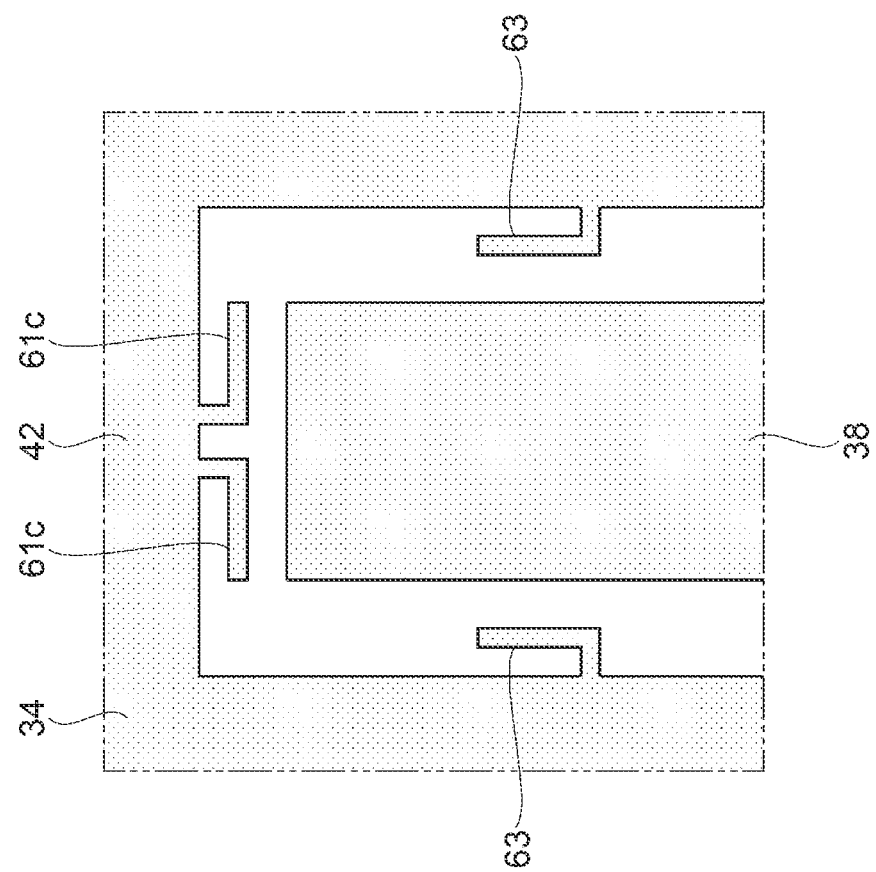
FIG. 8 is an enlarged view of a portion B in FIG. 7.

As shown in FIGS. 7 and 8, the sensor element 3c of the inertial sensor 1c is configured such that, in the first mass member 34 and the second mass member 35, first elastic members 61c are provided between the one end 311 of a first movable body 31c in the Y direction and the second movable bodies 38, and second elastic members 62c are provided between the other end 312 of the first movable body 31c in the Y direction and the third movable bodies 40. Further, third elastic members 63 are disposed between the first movable body 31c and the second movable bodies 38 in the X direction, and fourth elastic members 64 are disposed between the first movable body 31c and the third movable bodies 40 in the X direction.

Each of the first elastic member 61c and the second elastic member 62c includes a first member extending in the Y direction from the second coupling member 42 and the third coupling member 43, and a beam-shaped second member extending in the X direction from an end portion of the first member. Further, each of the third elastic member 63 and the fourth elastic member 64 includes a third member extending in the X direction from the first movable body 31c, and a beam-shaped fourth member extending in the Y direction from an end portion of the third member.

The two first elastic members 61c and the two second elastic members 62c each including the second member extending to the plus side in the X direction and the second member extending to the minus side in the X direction, are disposed between the one end 311 and the second movable bodies 38 and between the other end 312 and the third movable bodies 40. Further, the third elastic members 63 are disposed on the plus side in the X direction and the minus side in the X direction of the second movable bodies 38, and the fourth members of the third elastic members 63 each extend to the plus side in the Y direction. The fourth elastic members 64 are disposed on the plus side in the X direction and the minus side in the X direction of the third movable bodies 40, and the fourth members of the fourth elastic members 64 each extend to the minus side in the Y direction.

Since the second members have a beam shape extending in the X direction, the first elastic members 61c and the second elastic members 62c have a spring property in the Y direction. Therefore, an impact from the X direction can be alleviated. Further, since the fourth members have a beam shape extending in the Y direction, the third elastic members 63 and the fourth elastic members 64 have a spring property in the X direction. Therefore, an impact from the Y direction can be alleviated. It should be noted the shape of the first elastic members 61c, the second elastic members 62c, the third elastic members 63, and the fourth elastic members 64 is not limited as long as they have the spring property for alleviating the impact. Therefore, not only the beam shape but also a folded spring shape, a meander shape, a truss structure shape, a Rahmen structure shape, and the like may be used.

With such a configuration, damage to the second movable body 38 and the third movable body 40 due to the impact from the X direction and the Y direction is reduced, impact resistance of the second support beam 37 and the third support beam 39 is improved, and the same effects as those of the inertial sensor 1 according to the first embodiment can be obtained.

5. Fifth Embodiment

Figure 9:
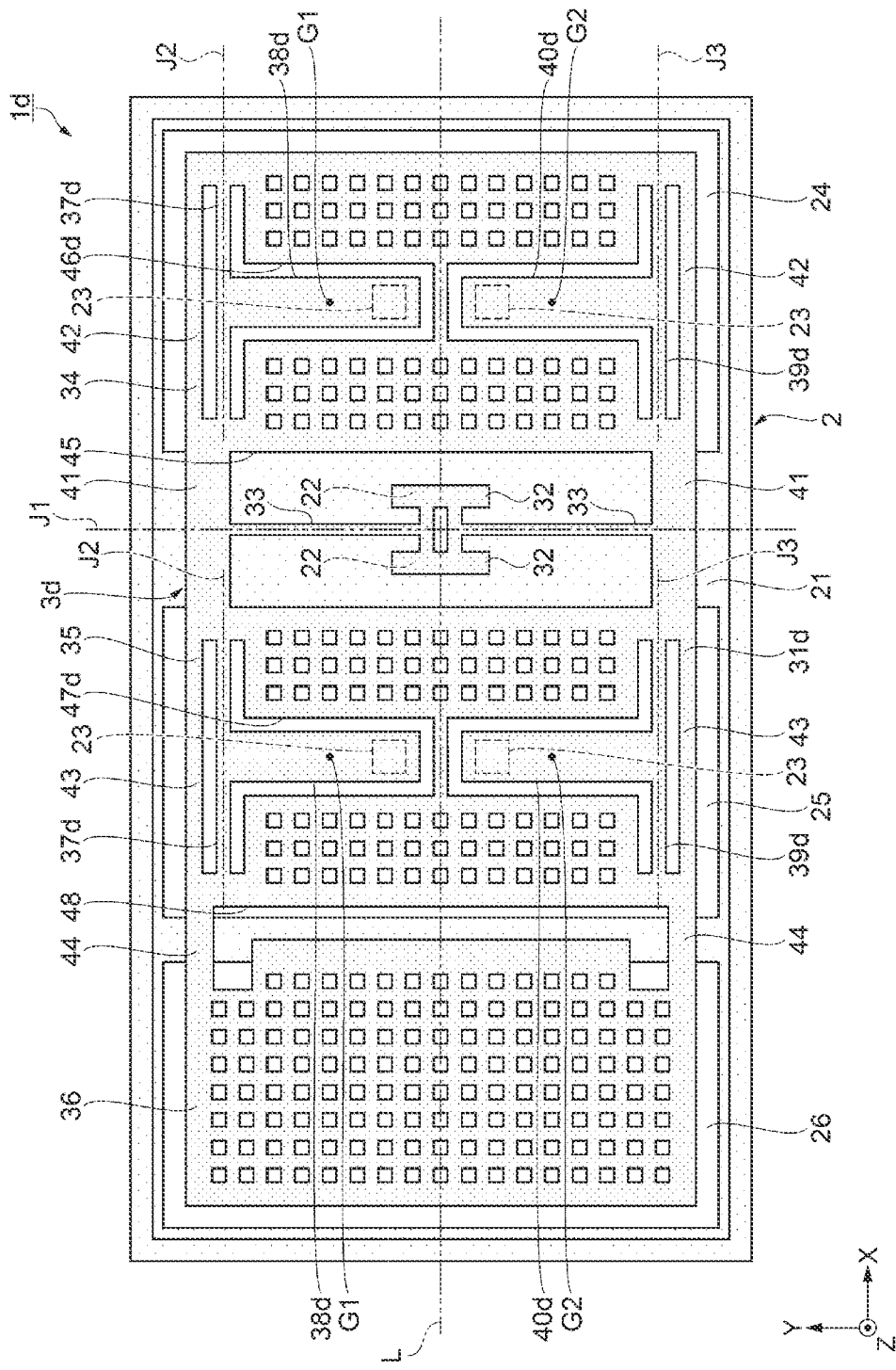
FIG. 9 is a plan view showing a schematic structure of an inertial sensor according to a fifth embodiment.

Next, an inertial sensor 1d according to a fifth embodiment will be described with reference to FIG. 9. FIG. 9 shows a state in which the lid 5 is removed for convenience of description.

The inertial sensor 1d according to the present embodiment is similar to the inertial sensor 1 according to the first embodiment except that a structure of a sensor element 3d is different from that of the inertial sensor 1 according to the first embodiment. Differences from the first embodiment described above will be mainly described, and the description of the similar matters will be omitted.

As shown in FIG. 9, in the sensor element 3d of the inertial sensor 1d, an interval between the center of gravity G1 of a second movable body 38d and the center line L is shorter than an interval between a second support beam 37d and the center line L, and an interval between the center of gravity G2 of a third movable body 40d and the center line L is shorter than an interval between a third support beam 39d and the center line L. That is, free ends of the second movable body 38d and the third movable body 40d are located closer to the center line L side than the second support beam 37d and the third support beam 39d, and the second support beam 37d and the third support beam 39d are located on the outer edge side of the first movable body 31. Therefore, when an impact is applied in a rotational direction in an XY plane with an intersection point of the center line L and the first rotation axisrotation axis J1 as a rotation axis, the free ends of the second movable body 38d and the third movable body 40d are close to the rotation axis, and thus a displacement amount due to the impact can be reduced. Therefore, an influence caused by the impact in the rotational direction in the XY plane can be reduced, and the same effects as those of the inertial sensor 1 according to the first embodiment can be obtained.

6. Sixth Embodiment

Figure 10:
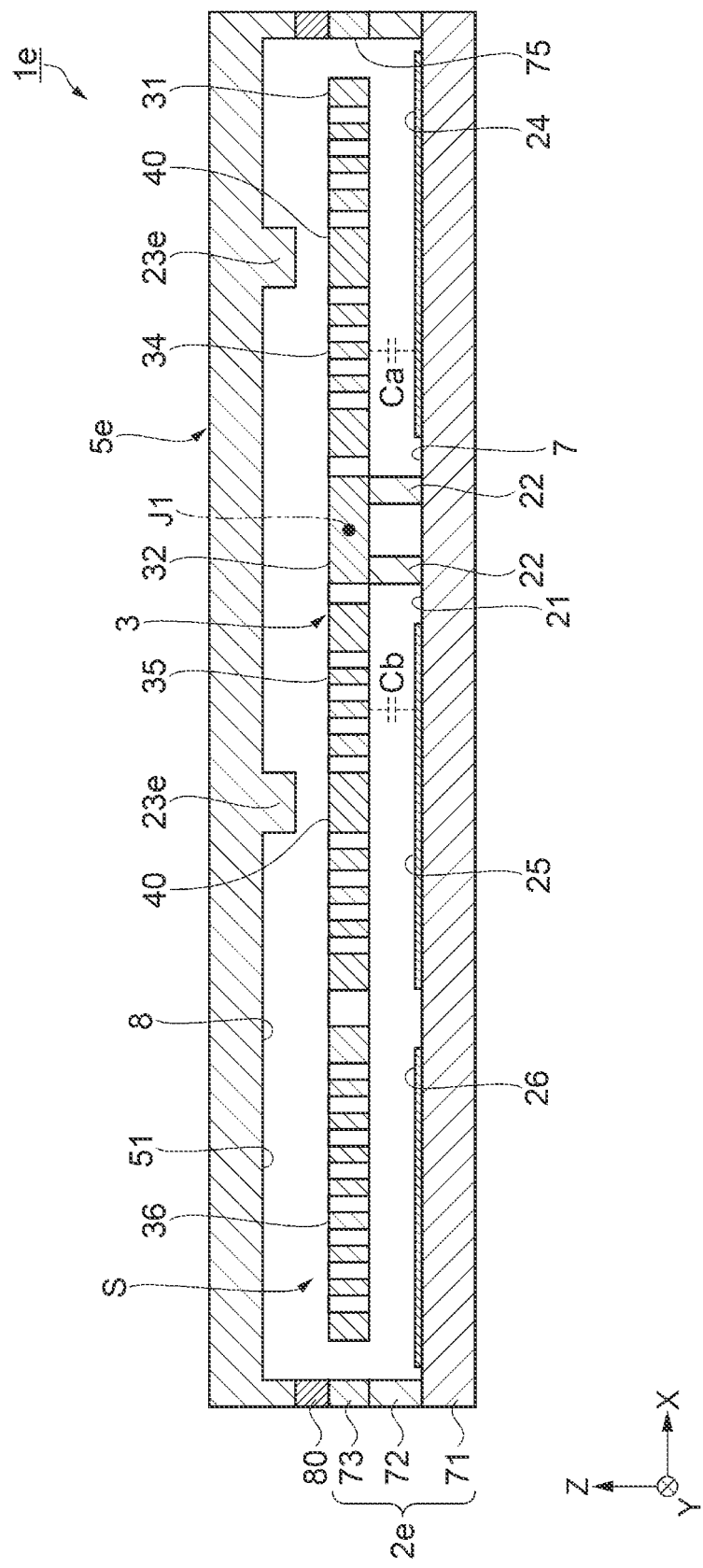
FIG. 10 is a cross-sectional view showing a schematic structure of an inertial sensor according to a sixth embodiment.

Next, an inertial sensor 1e according to a sixth embodiment will be described with reference to FIG. 10. FIG. 10 corresponds to a cross-sectional view taken along a line A-A in FIG. 1.

In the inertial sensor 1e according to the present embodiment, an SOI substrate is used as a substrate 2e. The SOI substrate is a substrate in which a single crystal silicon layer 73 is formed at an insulating layer 72 on a silicon substrate 71. However, in the present embodiment, the substrate is not limited to the single crystal silicon, and may be a substrate in which a polycrystalline silicon layer is formed at the insulating layer 72 on the silicon substrate 71. A lid 5e is bonded to the substrate 2e, and the sensor element 3 is accommodated inside the lid 5e. Therefore, compared to the inertial sensor 1 according to the first embodiment, the inertial sensor 1e according to the sixth embodiment is similar to the inertial sensor 1 according to the first embodiment except that structures of the substrate 2e and the lid 5e are different. Differences from the first embodiment described above will be mainly described, and the description of the similar matters will be omitted.

In the present embodiment, the lid 5e is bonded to the substrate 2e, and more specifically, the lid 5e is bonded via a bonding material 80. The bonding material 80 may be any material as long as sufficient airtightness can be maintained, and may be a glass frit material, a metal eutectic layer, a solder sealing material, and the like. A material for the first movable body 31 formed at the substrate 2e via the insulating layer 72 is single crystal silicon or polycrystalline silicon, and a peripheral member 75 using the same single crystal silicon or polycrystalline silicon is formed. The lid 5e of the inertial sensor 1e is bonded to the peripheral member 75 via the bonding material 80. As shown in FIG. 10, the lid 5e of the inertial sensor 1e is provided with protrusions 23e protruding toward the second movable body 38 and the third movable body 40 at a surface 8 which is a bottom surface of the recess portion 51 of the lid 5e. Therefore, when excessive seesaw swinging occurs in the first movable body 31, the protrusions 23e provided at the lid 5e come into contact with the second movable body 38 and the third movable body 40, so that the same effects as those of the inertial sensor 1 according to the first embodiment can be obtained. When the protrusions 23e are optimally designed, it is not necessary to change a depth of the recess portion 21 of the substrate, and the recess portion 21a is not necessary.

7. Seventh Embodiment

Figure 11:
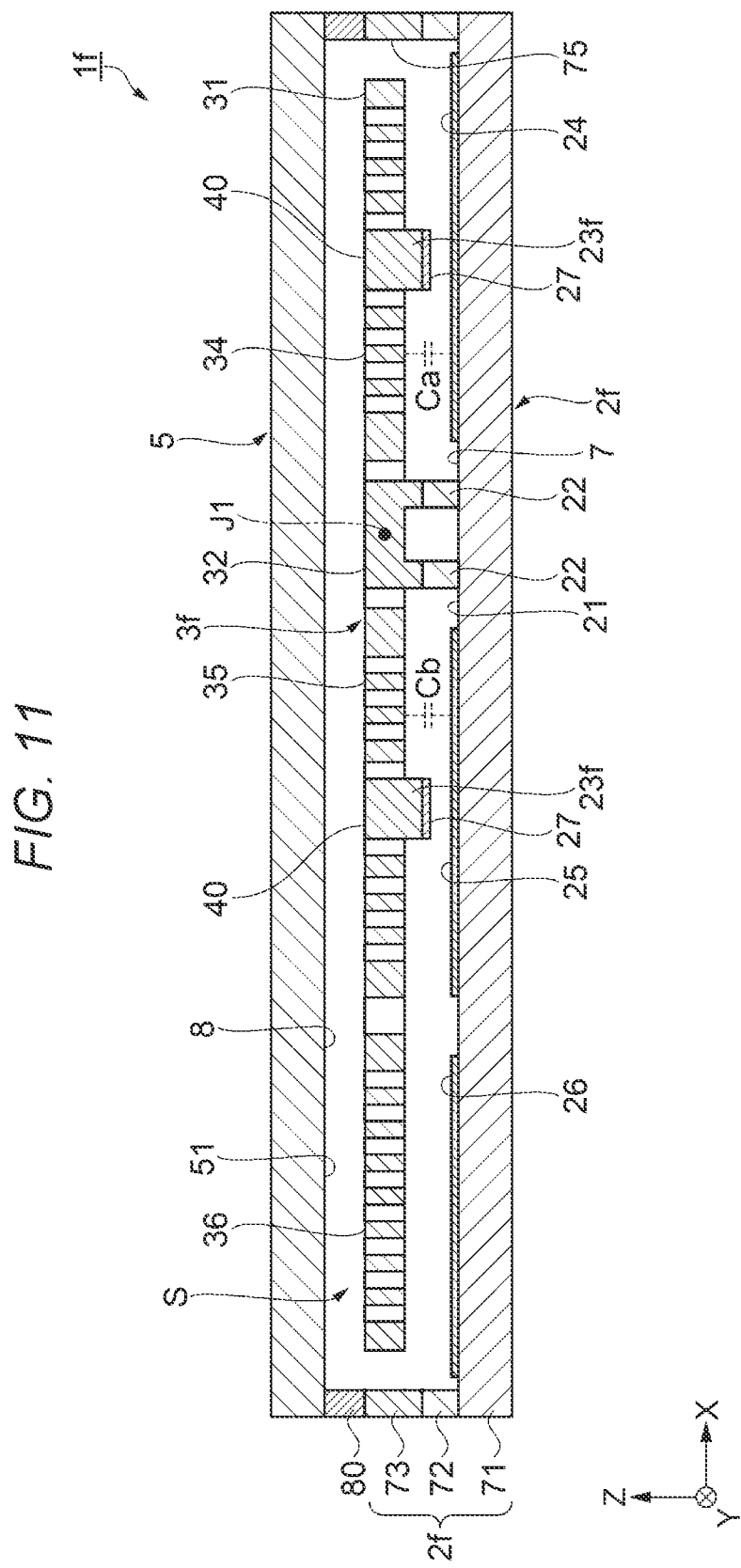
FIG. 11 is a cross-sectional view showing a schematic structure of an inertial sensor according to a seventh embodiment.

Next, an inertial sensor 1f according to a seventh embodiment will be described with reference to FIG. 11. FIG. 11 corresponds to a cross-sectional view taken along a line A-A in FIG. 1.

The inertial sensor 1f according to the present embodiment is similar to the inertial sensor 1 according to the first embodiment except that structures of a substrate 2f and a sensor element 3f are different from those of the inertial sensor 1 according to the first embodiment. Differences from the first embodiment described above will be mainly described, and the description of the similar matters will be omitted. Further, as in the sixth embodiment, an SOI substrate is used as the substrate 2f, and the recess portion 21a is not formed.

As shown in FIG. 11, in the sensor element 3f of the inertial sensor 1f, the second movable body 38 and the third movable body 40 are provided with protrusions 23f protruding toward the surface 7 which is a bottom surface of the recess portion 21 of the substrate 2f. Therefore, when excessive seesaw swinging occurs in the first movable body 31, the protrusions 23f provided at the second movable body 38 and the third movable body 40 come into contact with the surface 7 of the substrate 2f, so that the same effects as those of the inertial sensor 1 according to the first embodiment can be obtained.

8. Eighth Embodiment

Figure 12:
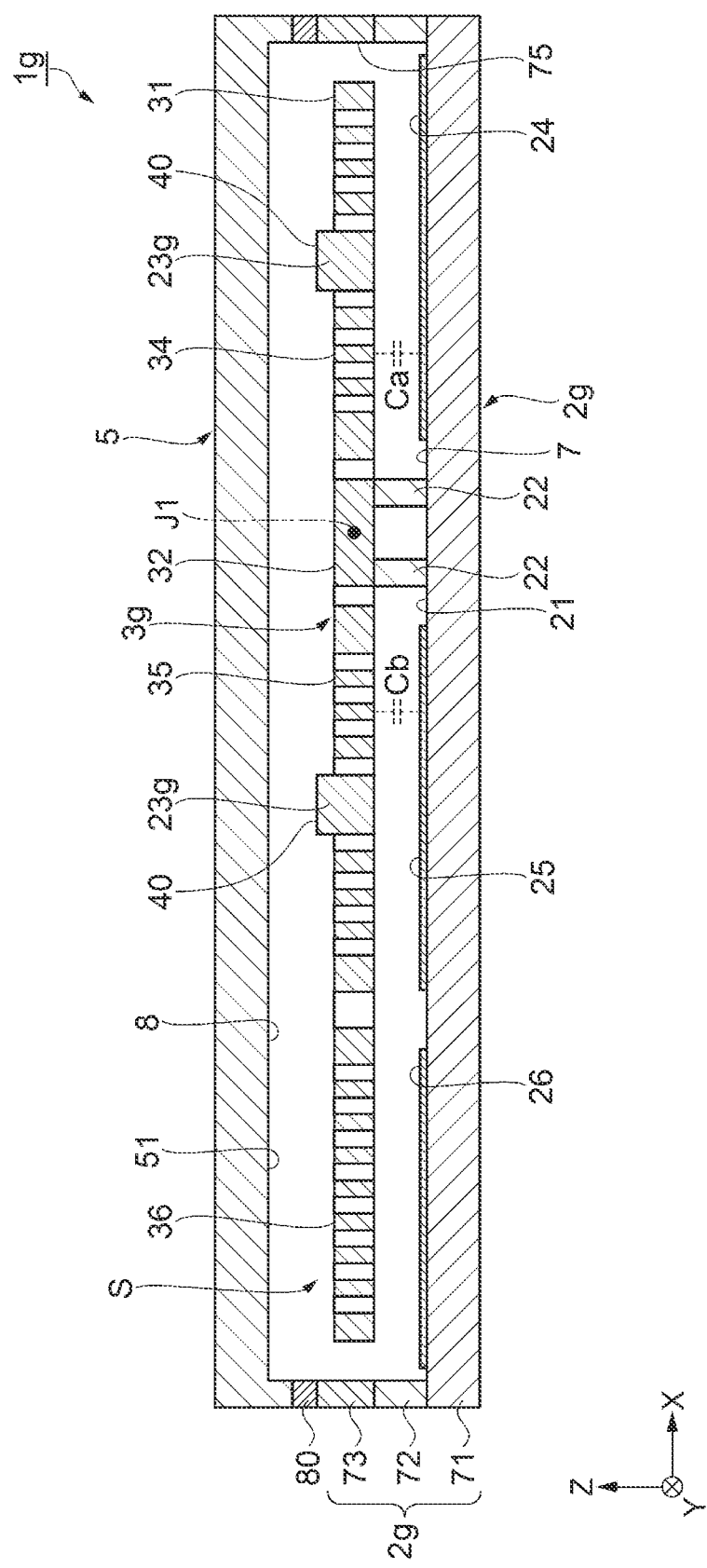
FIG. 12 is a cross-sectional view showing a schematic structure of an inertial sensor according to an eighth embodiment.

Next, an inertial sensor 1g according to an eighth embodiment will be described with reference to FIG. 12. FIG. 12 corresponds to a cross-sectional view taken along a line A-A in FIG. 1.

The inertial sensor 1g according to the present embodiment is similar to the inertial sensor 1 according to the first embodiment except that structures of a substrate 2g and a sensor element 3g are different from those of the inertial sensor 1 according to the first embodiment. Differences from the first embodiment described above will be mainly described, and the description of the similar matters will be omitted. Further, as in the sixth embodiment, an SOI substrate is used as the substrate 2g, and the recess portion 21a is not formed.

As shown in FIG. 12, in the sensor element 3g of the inertial sensor 1g, the second movable body 38 and the third movable body 40 are provided with protrusions 23g protruding toward the surface 8 which is a bottom surface of the recess portion 51 of the lid 5. Therefore, when excessive seesaw swinging occurs in the first movable body 31, the protrusions 23g provided at the second movable body 38 and the third movable body 40 come into contact with the surface 8 of the lid 5, so that the same effects as those of the inertial sensor 1 according to the first embodiment can be obtained.

9. Ninth Embodiment

Next, an inertial measurement unit 2000 including any one of the inertial sensors 1 to 1g according to the ninth embodiment will be described with reference to FIGS. 13 and 14. In the following description, a configuration to which the inertial sensor 1 is applied will be described as an example.

Figure 13:
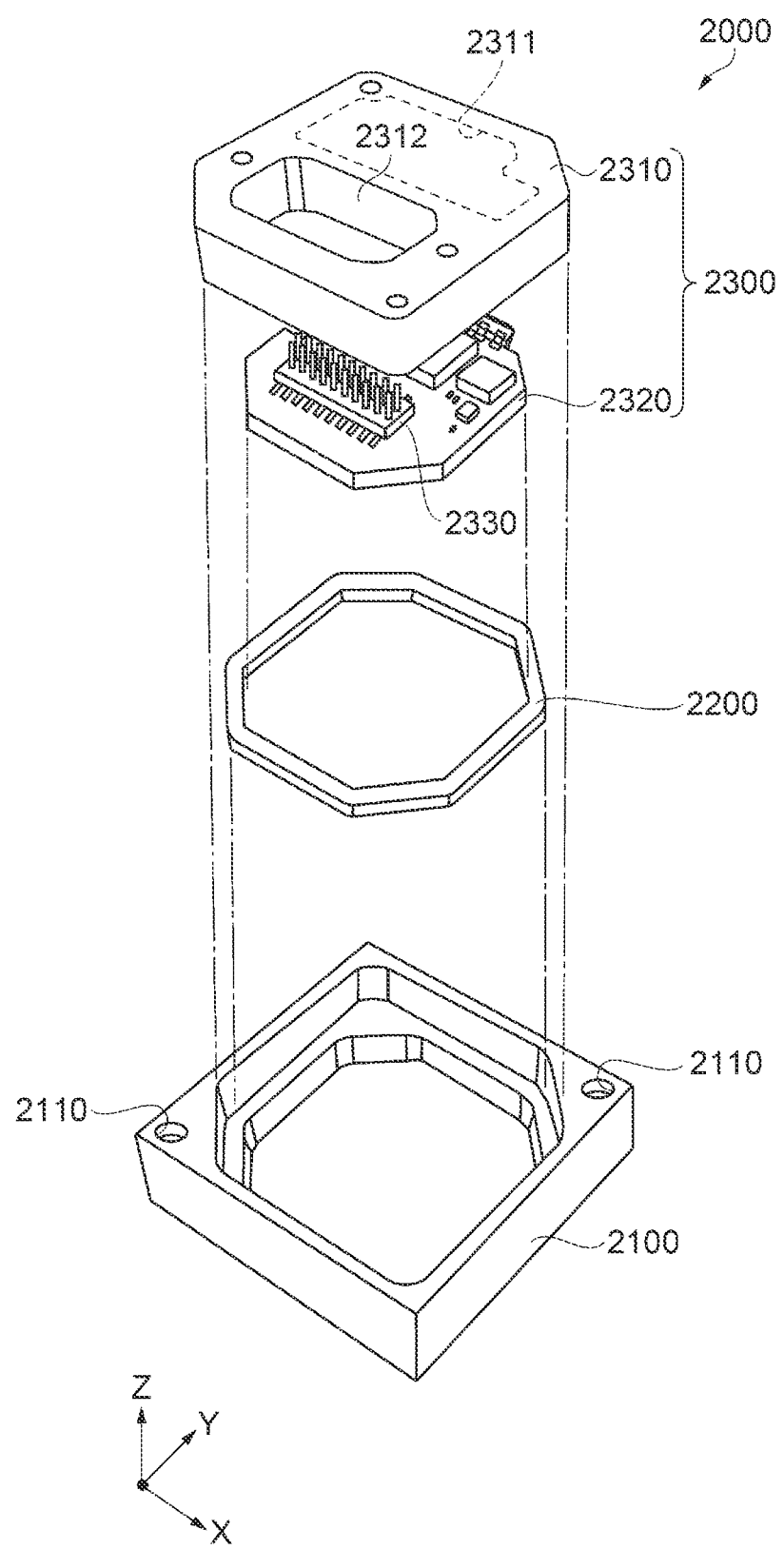
FIG. 13 is an exploded perspective view showing a schematic configuration of an inertial measurement unit including an inertial sensor according to a ninth embodiment.

The inertial measurement unit (IMU) 2000 shown in FIG. 13 is a device that detects an inertial motion amount such as a posture or a behavior of a moving body such as an automobile or a robot. The inertial measurement unit 2000 functions as a so-called six-axis motion sensor including an acceleration sensor that detects acceleration Ax, Ay, and Az in directions along three axes and an angular velocity sensor that detects angular velocities ωx, ωy, and ωz around the three axes.

The inertial measurement unit 2000 is a rectangular parallelepiped having a substantially square planar shape. Screw holes 2110 as fixing members are formed in the vicinity of vertices at two locations located in a diagonal direction of the square. Two screws can be inserted into the screw holes 2110 at two locations to fix the inertial measurement unit 2000 to a target surface of a target body of mounting such as an automobile. It is also possible to reduce the size to a degree that can be mounted on a smartphone or a digital camera, for example, by selecting a component or changing the design.

The inertial measurement unit 2000 includes an outer case 2100, a bonding member 2200, and a sensor module 2300, and has a configuration in which the sensor module 2300 is inserted inside the outer case 2100 with the bonding member 2200 interposed therebetween. Further, the sensor module 2300 includes an inner case 2310 and a substrate 2320.

Similarly to an overall shape of the inertial measurement unit 2000, the outer case 2100 has an outer shape of a rectangular parallelepiped having a substantially square planar shape, and the screw holes 2110 are formed in the vicinity of vertices at two positions located in a diagonal direction of the square, respectively. Further, the outer case 2100 has a box shape, and the sensor module 2300 is accommodated inside the outer case 2100.

The inner case 2310 is a member that supports the substrate 2320, and has a shape in which the inner case 2310 is accommodated inside the outer case 2100. The inner case 2310 is formed with a recess portion 2311 for preventing contact with the substrate 2320 and an opening 2312 for exposing a connector 2330 to be described later. Such an inner case 2310 is bonded to the outer case 2100 via the bonding member 2200. Further, the substrate 2320 is bonded to a lower surface of the inner case 2310 via an adhesive.

Figure 14:
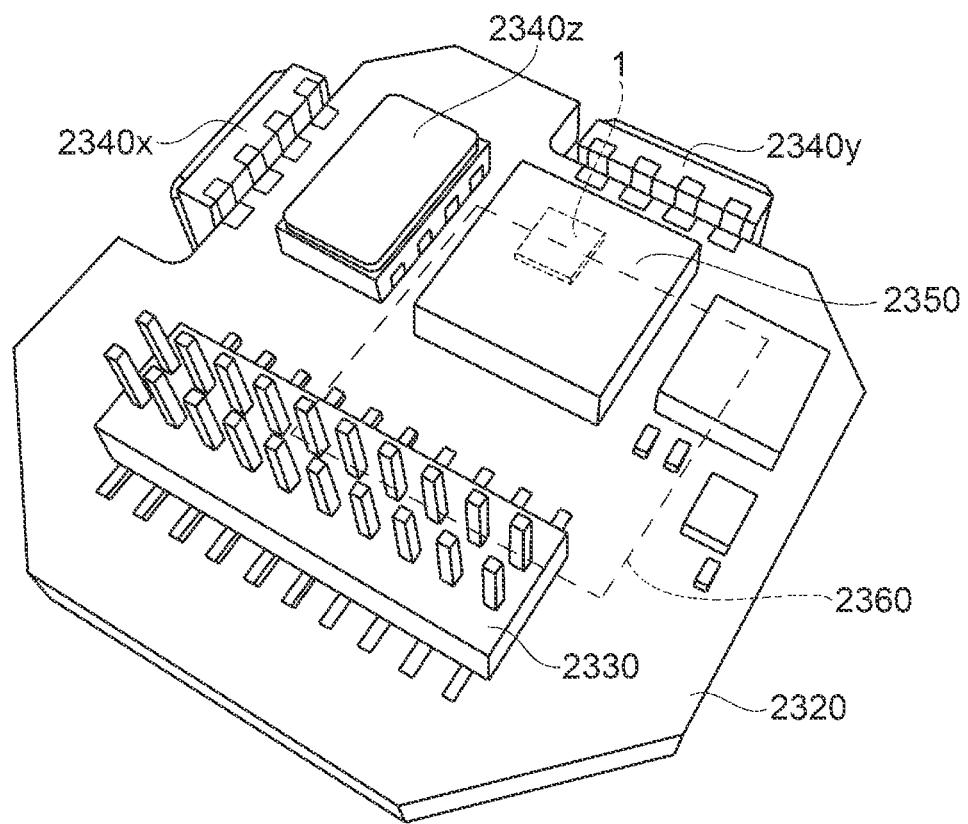
FIG. 14 is a perspective view of a substrate of FIG. 13.

As shown in FIG. 14, the connector 2330, an angular velocity sensor 2340z that detects an angular velocity around a Z axis, an acceleration sensor unit 2350 that detects acceleration in each axial direction of an X axis, a Y axis, and the Z axis, and the like are mounted on an upper surface of the substrate 2320. Further, an angular velocity sensor 2340x that detects an angular velocity around the X axis and an angular velocity sensor 2340y that detects an angular velocity around the Y axis are mounted on a side surface of the substrate 2320.

The acceleration sensor unit 2350 includes at least the inertial sensor 1 for measuring the acceleration in the Z direction described above, and can detect acceleration in one axial direction or accelerations in two axial directions or three axial directions as necessary. The angular velocity sensors 2340x, 2340y, and 2340z are not particularly limited, and for example, a vibration gyro sensor using a Coriolis force can be used.

Further, a control IC 2360 is mounted at a lower surface of the substrate 2320. The control IC 2360 as a control unit that performs control based on a detection signal output from the inertial sensor 1 is a micro-controller unit (MCU), includes a storage unit including a nonvolatile memory, an A/D converter, and the like therein, and controls each unit of the inertial measurement unit 2000. The storage unit stores a program defining an order and a content for detecting the acceleration and the angular velocity, a program for digitizing detection data and incorporating the digitized detection data into packet data, accompanying data, and the like. In addition, a plurality of electronic components are mounted at the substrate 2320.

Since such an inertial measurement unit 2000 uses the acceleration sensor unit 2350 including the inertial sensor 1, the inertial measurement unit 2000 having excellent impact resistance and high reliability can be obtained.

What is claimed is:
1. An inertial sensor comprising:
a substrate;
a first movable body disposed above the substrate and configured to swing around a first rotation axis along a first direction;
a first support beam supporting the first movable body as the first rotation axis, and
a lid bonded to the substrate and covering the first movable body and the first support beam, wherein
the first movable body has an opening, the opening being substantially cross-shaped and extending along the first direction and a second direction perpendicular to the first direction, the opening being located between the first support beam and one end of the first movable body along the second direction,
a contour of the opening surrounds:
a second movable body configured to swing around a second rotation axis along the second direction, the second movable body extending along the first direction;
a second support beam coupling the first movable body and the second movable body and supporting the second movable body as the second rotation axis;
a third movable body configured to swing around a third rotation axis along the second direction, the third movable body extending along the first direction; and
a third support beam coupling the first movable body and the third movable body and supporting the third movable body as the third rotation axis, and
a protrusion is provided at a surface of the substrate or the lid facing one of the second movable body and the third movable body, or at one of the second movable body and the third movable body,
the protrusion overlaps the one of the second movable body and the third movable body in a plan view, and
the protrusion protrudes toward one of the second movable body and the third movable body or toward the surface of the substrate.
2. The inertial sensor according to claim 1, wherein
the second movable body and the third movable body are disposed in line symmetry with respect to a center line along the second direction of the first movable body as a symmetry axis,
a center of gravity of the second movable body is closer to the second support beam than the center line, and
a center of gravity of the third movable body is closer to the third support beam than the center line.
3. The inertial sensor according to claim 2, wherein
the second support beam coincides with an end portion of the second movable body at a position adjacent to the center line, and
the third support beam coincides with an end portion of the third movable body at a position adjacent to the center line.
4. The inertial sensor according to claim 2, wherein
an end portion of the second movable body at a position adjacent to the center line is closer to the center line than the second support beam, and
an end portion of the third movable body at a position adjacent to the center line is closer to the center line than the third support beam.

5. The inertial sensor according to claim 1, wherein the second support beam and the third support beam have higher torsional rigidity than the first support beam.

6. The inertial sensor according to claim 1, wherein
a resonance frequency of the second movable body around the second rotation axis is twice or more a resonance frequency of the first movable body around the first rotation axis, and
a resonance frequency of the third movable body around the third rotation axis is twice or more the resonance frequency of the first movable body around the first rotation axis.

7. The inertial sensor according to claim 1, wherein
a resonance frequency of the second movable body and the third movable body in an in-phase mode around the second rotation axis or around the third rotation axis is twice or more a resonance frequency of the first movable body around the first rotation axis.

8. The inertial sensor according to claim 1, further comprising:
a first elastic member provided between one end of the first movable body in the first direction and the second movable body; and
a second elastic member provided between the other end of the first movable body in the first direction and the third movable body.

9. The inertial sensor according to claim 8, further comprising:
a third elastic member; and
a fourth elastic member, wherein
the third elastic member and the fourth elastic member are disposed between the first movable body and the second movable body and between the first movable body and the third movable body in the second direction.

10. An inertial sensor comprising:
a substrate;
a first movable body disposed above the substrate and configured to swing around a first rotation axis along a first direction;
a first support beam supporting the first movable body as the first rotation axis; and
a lid bonded to the substrate and covering the first movable body and the first support beam, wherein
the first movable body has an opening, the opening being substantially cross-shaped and extending along the first direction and a second direction perpendicular to the first direction, the opening being located between the first support beam and one end of the first movable body along the second direction,
a contour of the opening surrounds:
a second movable body configured to swing around a second rotation axis along the second direction, the second movable body extending along the first direction;
a second support beam coupling the first movable body and the second movable body and supporting the second movable body as the second rotation axis;
a third movable body configured to swing around a third rotation axis along the second direction, the third movable body extending along the first direction; and
a third support beam coupling the first movable body and the third movable body and supporting the third movable body as the third rotation axis, and
a protrusion is provided at a surface of the substrate or the lid facing one of the second movable body and the third movable body,
the protrusion overlaps with one of the second movable body and the third movable body in a plan view, and
the protrusion protrudes toward one of the second movable body and the third movable body.

11. An inertial sensor comprising:
a substrate;
a first movable body disposed above the substrate and configured to swing around a first rotation axis along a first direction;
a first support beam supporting the first movable body as the first rotation axis; and
a lid bonded to the substrate and covering the first movable body and the first support beam, wherein
the first movable body has an opening, the opening being substantially cross-shaped and extending along the first direction and a second direction perpendicular to the first direction, the opening being located between the first support beam and one end of the first movable body along the second direction,
a contour of the opening surrounds:
a second movable body configured to swing around a second rotation axis along the second direction, the second movable body extending along the first direction;
a second support beam coupling the first movable body and the second movable body and supporting the second movable body as the second rotation axis;
a third movable body configured to swing around a third rotation axis along the second direction, the third movable body extending along the first direction; and
a third support beam coupling the first movable body and the third movable body and supporting the third movable body as the third rotation axis, and
a protrusion is provided at the second movable body and the third movable body,
the protrusion overlaps with one of the second movable body and the third movable body in a plan view, and
the protrusion protrudes toward a surface of the substrate or the lid facing the second movable body and the third movable body.

12. An inertial measurement device comprising:
the inertial sensor according to claim 1; and
a controller configured to perform control based on a detection signal output from the inertial sensor.

* * * * *